US012700685B2

(12) United States Patent
Brewer et al.

(10) Patent No.: US 12,700,685 B2
(45) Date of Patent: Aug. 4, 2026

(54) WIRE COMB WITH CURVED ARCUATE SECTION CONFIGURED TO ENGAGE A PRINTED CIRCUIT BOARD

(71) Applicant: Vertiv IT Systems, Inc., Huntsville, AL (US)

(72) Inventors: Jeffrey Alan Brewer, Huntsville, AL (US); Amanda Conger, Huntsville, AL (US); Christopher De Jesus, Huntsville, AL (US); Johnny Lee Erskine, Harvest, AL (US); Joseph Michael O'Berry, Cullman, AL (US); Haralson Kerr Reeves, Jr., Gadsden, AL (US); Tony Tumlin, Huntsville, AL (US); Christopher Wood, Madison, AL (US)

(73) Assignee: Vertiv Corporation, Westerville, OH (US)

( * ) Notice: Subject to any disclaimer, the term of this patent is extended or adjusted under 35 U.S.C. 154(b) by 863 days.

(21) Appl. No.: 17/890,413

(22) Filed: Aug. 18, 2022

(65) Prior Publication Data

US 2023/0056662 A1    Feb. 23, 2023

Related U.S. Application Data

(60) Provisional application No. 63/235,332, filed on Aug. 20, 2021.

(51) Int. Cl.
| | |
|---|---|
| *H01R 12/53* | (2011.01) |
| *H01R 12/59* | (2011.01) |
| *H05K 1/11* | (2006.01) |

(52) U.S. Cl.
CPC ........... *H01R 12/53* (2013.01); *H01R 12/592* (2013.01); *H05K 1/111* (2013.01); *H05K 2201/10189* (2013.01); *H05K 2201/10356* (2013.01)

(58) Field of Classification Search
CPC ....... H05K 3/3405; H05K 2201/10424; H05K 2201/10356; H01R 43/0256;
(Continued)

(56) References Cited

U.S. PATENT DOCUMENTS

| | | | | |
|---|---|---|---|---|
| 2,007,174 A | * | 7/1935 | Benjamin | ................ H02B 1/00 |
| | | | | 361/834 |
| 3,588,081 A | | 6/1971 | Jopson | |

(Continued)

FOREIGN PATENT DOCUMENTS

| | | |
|---|---|---|
| CN | 201315358 Y | 9/2009 |
| CN | 107768852 A | 3/2018 |

(Continued)

OTHER PUBLICATIONS

International Search Report and Written Opinion for International Application No. PCT/US2022/040753 mailed Dec. 7, 2022.
(Continued)

*Primary Examiner* — Marcus E Harcum
(74) *Attorney, Agent, or Firm* — Suiter Swantz IP

(57) ABSTRACT

The present invention is directed to a wire comb. The wire comb includes a flat body which includes a first end and a second end. The ends are connected by an arcuate section which has an upper and lower surface. The upper surface of the arcuate section has a wire mount area that includes at least one opening formed in the upper surface with each opening including a shape selected to receive and hold a wire within. A mounting feature extends from at least one of the first end and the second end. The mounting feature is adapted to engage a printed circuit board.

16 Claims, 7 Drawing Sheets

(58) Field of Classification Search

CPC ............ H01R 43/0249; H01R 43/0263; H01R 12/53; H01R 12/62

USPC .......................................................... 439/719

See application file for complete search history.

(56) References Cited

U.S. PATENT DOCUMENTS

| | | | |
|---|---|---|---|
| 3,936,933 A | | 2/1976 | Folk |
| 4,101,189 A | * | 7/1978 | Moser .................. H01R 4/2429 |
| | | | 439/456 |
| 4,132,252 A | | 1/1979 | Shatto, Jr. |
| 4,378,823 A | | 4/1983 | Normann |
| 4,420,020 A | | 12/1983 | Mcgeary |
| 4,972,042 A | * | 11/1990 | Seabourne .......... G02B 6/4476 |
| | | | 174/DIG. 8 |
| 5,005,611 A | | 4/1991 | Hecker |
| 5,857,259 A | | 1/1999 | Johnston |
| 6,123,588 A | * | 9/2000 | Johnston ................ H05K 3/325 |
| | | | 439/876 |
| 6,293,829 B1 | * | 9/2001 | Qiao .................. H01R 13/5045 |
| | | | 439/942 |
| 6,482,028 B2 | | 11/2002 | Kumamoto |
| 6,726,503 B2 | * | 4/2004 | Waddell ............. H01R 13/6585 |
| | | | 439/607.05 |
| 6,792,675 B2 | | 9/2004 | Tran |
| 6,824,427 B1 | | 11/2004 | Feldman |
| 6,976,512 B2 | | 12/2005 | Loeffler |
| 7,040,918 B2 | * | 5/2006 | Moriyama ............. H01R 43/20 |
| | | | 439/497 |
| 7,089,971 B2 | | 8/2006 | Spain |
| 7,119,280 B1 | * | 10/2006 | Ray ...................... H02G 3/0437 |
| | | | 174/72 A |
| 7,189,103 B1 | | 3/2007 | Brown |
| 7,229,310 B1 | * | 6/2007 | Brown ............... H01R 43/0256 |
| | | | 439/493 |
| 7,275,953 B2 | | 10/2007 | Brown |
| 7,549,895 B2 | | 6/2009 | Kondo et al. |
| 7,837,522 B1 | | 11/2010 | Hoover |
| 8,182,281 B2 | * | 5/2012 | Miller .................. H01R 4/2416 |
| | | | 439/397 |
| 8,342,459 B2 | * | 1/2013 | Garrison ............... H01R 12/63 |
| | | | 248/68.1 |
| 8,735,727 B2 | * | 5/2014 | Chen ...................... G06F 1/181 |
| | | | 361/752 |
| 9,203,193 B2 | * | 12/2015 | Hackman ............ H01R 13/648 |
| 9,548,549 B1 | * | 1/2017 | Masuyama ......... H01R 12/598 |
| 10,826,259 B2 | | 11/2020 | Lo |
| 10,931,040 B1 | * | 2/2021 | Diaz .................... H05K 1/0246 |
| 2004/0221916 A1 | | 11/2004 | Edwards |
| 2005/0232641 A1 | * | 10/2005 | Ice ..................... H01R 12/7076 |
| | | | 398/162 |
| 2006/0096654 A1 | | 5/2006 | Loeffler |
| 2010/0132979 A1 | | 6/2010 | Chen |
| 2011/0111646 A1 | * | 5/2011 | Ahmed .................... H04Q 1/06 |
| | | | 29/525.01 |
| 2013/0252471 A1 | | 9/2013 | Wu et al. |
| 2014/0138154 A1 | * | 5/2014 | Sugiyama ............. H01B 13/00 |
| | | | 29/857 |
| 2014/0191457 A1 | | 7/2014 | Sharma |
| 2016/0148743 A1 | | 5/2016 | Edwards |
| 2020/0203854 A1 | * | 6/2020 | Tamura ................. G01J 3/0202 |

FOREIGN PATENT DOCUMENTS

| | | | | |
|---|---|---|---|---|
| EP | 1398851 | | 3/2004 | |
| EP | 1437798 | | 7/2004 | |
| JP | 2014127460 A | * | 7/2014 | ............ H01R 12/57 |
| WO | WO-2012137547 A1 | * | 10/2012 | ............ H01R 12/53 |
| WO | 2014105585 A1 | | 7/2014 | |

OTHER PUBLICATIONS

European Patent Office, Extended European Search Report received in EP Application No. 22859163.2, May 12, 2025, 14 pages.

* cited by examiner

WIRE COMB WITH CURVED ARCUATE SECTION CONFIGURED TO ENGAGE A PRINTED CIRCUIT BOARD

CROSS REFERENCE TO RELATED APPLICATION

The present application claims priority from U.S. provisional application Ser. No. 63/235,332, filed Aug. 20, 2021, the disclosure of which is hereby incorporated by reference into the present disclosure.

FIELD OF THE INVENTION

The present disclosure relates to connecting wires to circuit boards.

BACKGROUND OF THE INVENTION

The statements in this section merely provide background information related to the present disclosure and may not constitute prior art.

A wire comb is a small component that facilitates the positioning of a wire for soldering. Typical wire combs are often included as specialized soldering fixtures used in manufacturing.

More recently, wire combs have been included as small plastic components that attach to a printed circuit board (PCB) in order to mount individual wires from multi-wire cables onto PCBs. These wire combs are mounted adjacent one or more ends of a PCB in order to permit the individual wires to be spaced apart yet held in place during a soldering, over-molding or other process while permitting connecting the wires to the appropriate connections on the circuit board. After undergoing the appropriate soldering processes, the PCB and the wire comb are but two components in a finished PCB assembly (PCBA). Non-limiting examples of such a wire combs are U.S. Pat. No. 7,189,103, filed Dec. 7, 2005 by Applicant; U.S. Pat. No. 7,275,953, filed Aug. 2, 2007 by Applicant; and U.S. Pat. No. 7,229,310, filed Sep. 12, 2006 by Applicant.

Previous wire combs, including those of the Applicant, have successfully achieved the goal of facilitating the spacing apart of individual wires during a soldering process. However, in the case of a multi-wire cable (such as a USB cable) previous wire combs require that each wire be cut to different lengths. Cutting wires to different lengths requires more manufacturing steps than cutting multiple wires to the same length in a single step. Moreover, it is generally desirable that each length of exposed or unshielded wires in the PCBA be minimized. Exposed wires can cause the signal carried in the wires to become degraded.

Accordingly, there is a need for a solution to at least one of the aforementioned problems. For example, there is an established need for a wire comb where each wire can be cut to the same length. For another example, there is an established need to minimize the length of exposed wire in a PCBA. There is also an established need for a reduction in the number of manufacturing steps required to produce a PCBA.

SUMMARY OF THE INVENTION

This section provides a general summary of the disclosure and is not a comprehensive disclosure of its full scope or all of its features.

The present invention is directed to a wire comb. The wire comb includes a flat body which includes a first end and a second end. The ends are connected by an arcuate section which has an upper and lower surface. The upper surface of the arcuate section has a wire mount area that includes at least one opening formed in the upper surface with each opening including a shape selected to receive and hold a wire within. A mounting feature extends from at least one of the first end and the second end. The mounting feature is adapted to engage a printed circuit board.

Alternative embodiments are contemplated in which the first wire mount area further includes a first guide feature and a second guide feature. The first and second guide features cooperate to form a first of the at least one openings formed in the upper surface. Other embodiments are contemplated where the second guide feature includes an overhang that extends over the upper surface of the arcuate section. The second guide feature is adapted to engage a printed circuit board. Embodiments are contemplated where the overhang further includes a hook or taper. The hook or taper is adapted to engage a printed circuit board. Embodiments are contemplated where the first wire mount area includes a third guide feature and a fourth guide feature. The third and fourth guide features cooperate to form a second of the at least one openings formed in the upper surface. In addition, the second of the at least one openings has a different shape than the first opening, and is also adapted to receive and hold a wire within. Embodiments are contemplated in which a second wire mount area on the lower surface of the arcuate section forms at least one opening in the lower surface. Each opening has a second shape selected to receive and hold a wire within. The second wire mount area includes a third and fourth guide features that cooperate to form one of the at least one openings formed in the lower surface. Embodiments are contemplated where the mounting feature includes an arm extending away from the flat body, a living hinge connected the arm to the flay body and a dimple disposed on the arm. Embodiments are contemplated where each of the at least one openings are formed in the lower surface and extend between the upper and lower surfaces of the arcuate section.

The present invention is further directed to a circuit board assembly. The circuit board assembly includes a printed circuit board (PCB) that has an upper and a lower surface, opposing ends, and side edges. The circuit board assembly also includes a wire comb which is mounted on the upper surface of the PCB and also is mounted proximate to an end of the PCB. The wire comb includes a flat body which includes a first end and a second end. The ends are connected by an arcuate section which has an upper and lower surface. The upper surface of the arcuate section has a wire mount area that includes at least one opening formed in the upper surface with each opening including a first shape. A mounting feature extends from at least one of the first end and the second end. The mounting feature engages the bottom surface of the printed circuit board. The PCBA further includes multi-wire cable composed of a number of wires arranged in an arcuate pattern that corresponds to the arcuate section of the wire comb's flat body. Each individual wire includes an insulated portion located in one of the number of openings of the wire mount area and a stripped portion located proximate the upper surface of the PCB.

Alternative embodiments are contemplated where the PCB further includes a plurality of solder pads arranged in an arcuate pattern that corresponds to the number of openings of the wire mount area. Embodiments are contemplated in which solder attaches each of the stripped portion of each wire to each of the solder pads. Embodiments are contemplated where the insulated portion of each wire is secured to each of the plurality of openings either with a press fit, an adhesive, or a combination of each. Embodiments are contemplated where the first wire mount area further includes a first guide feature and a second guide feature. The first and second guide features cooperate to form one of the number of openings formed in the upper surface of the arcuate section. Embodiments are contemplated where the second guide feature includes an overhang that extends over the upper surface of the arcuate section. The overhang engages the upper surface of the PCB. Embodiments are contemplated where the overhang further includes a hook or taper; and the hook or taper engages the upper surface of the PCB. Embodiments are contemplated where the mounting feature includes an arm that extends away from the flat body, a living hinge that connects the arm to the flay body and biases the arm towards the bottom surface of the PCB, and a dimple disposed on the arm that engages the bottom surface of the PCB.

The present invention is also directed to a wire comb. The wire comb includes an integrally formed body. The integrally formed body includes a first end and a second end that are connected by an arcuate section having upper and lower surfaces. The wire comb also includes a mounting feature that extends from one of the first end or the second end and is configured to engage a PCB. The arcuate section defines a number of tunnels that extend between the upper surface and the lower surface. Each of the tunnels has a shape that is selected to receive and hold a wire within.

Alternative embodiments are contemplated where the arcuate section includes a first guide feature and a second guide feature. The first and second guide features cooperate to form part of one of the number of tunnels. Embodiments are contemplated where the arcuate section includes a third guide feature and a fourth guide feature. The third and fourth guide features cooperate to form a portion of a second one of the number of tunnels. One of the tunnels has a first width and the other of plurality of tunnels has a second width that is different from the first width.

These and other objects, features, and advantages of the present invention will become more readily apparent from the attached drawings and the detailed description of the preferred embodiments, which follow.

BRIEF DESCRIPTION OF THE DRAWINGS

The preferred embodiments of the invention will hereinafter be described in conjunction with the appended drawings provided to illustrate and not to limit the invention, where like designations denote like elements, and in which.

Like reference numerals refer to like parts throughout the several views of the drawings.

DETAILED DESCRIPTION

The following detailed description is merely exemplary in nature and is not intended to limit the described embodiments or the application and uses of the described embodiments. As used herein, the word "exemplary" or "illustrative" means "serving as an example, instance, or illustration." Any implementation described herein as "exemplary" or "illustrative" is not necessarily to be construed as preferred or advantageous over other implementations. All of the implementations described below are exemplary implementations provided to enable persons skilled in the art to make or use the embodiments of the disclosure and are not intended to limit the scope of the disclosure, which is defined by the claims. For purposes of description herein, the terms "upper", "lower", "left", "rear", "right", "front", "vertical", "horizontal", and derivatives thereof shall relate to the invention as oriented in FIG. 1. Furthermore, there is no intention to be bound by any expressed or implied theory presented in the preceding technical field, background, brief summary or the following detailed description. It is also to be understood that the specific devices and processes illustrated in the attached drawings, and described in the following specification, are simply exemplary embodiments of the inventive concepts defined in the appended claims. Hence, specific dimensions and other physical characteristics relating to the embodiments disclosed herein are not to be considered as limiting, unless the claims expressly state otherwise.

Shown throughout the figures, the present invention is directed towards a wire comb and a PCB assembly (PCBA) that includes a wire comb. Referring initially to FIGS. 1-4, one embodiment of a wire comb is depicted in accordance with an exemplary embodiment of the present invention.

Figure 1:
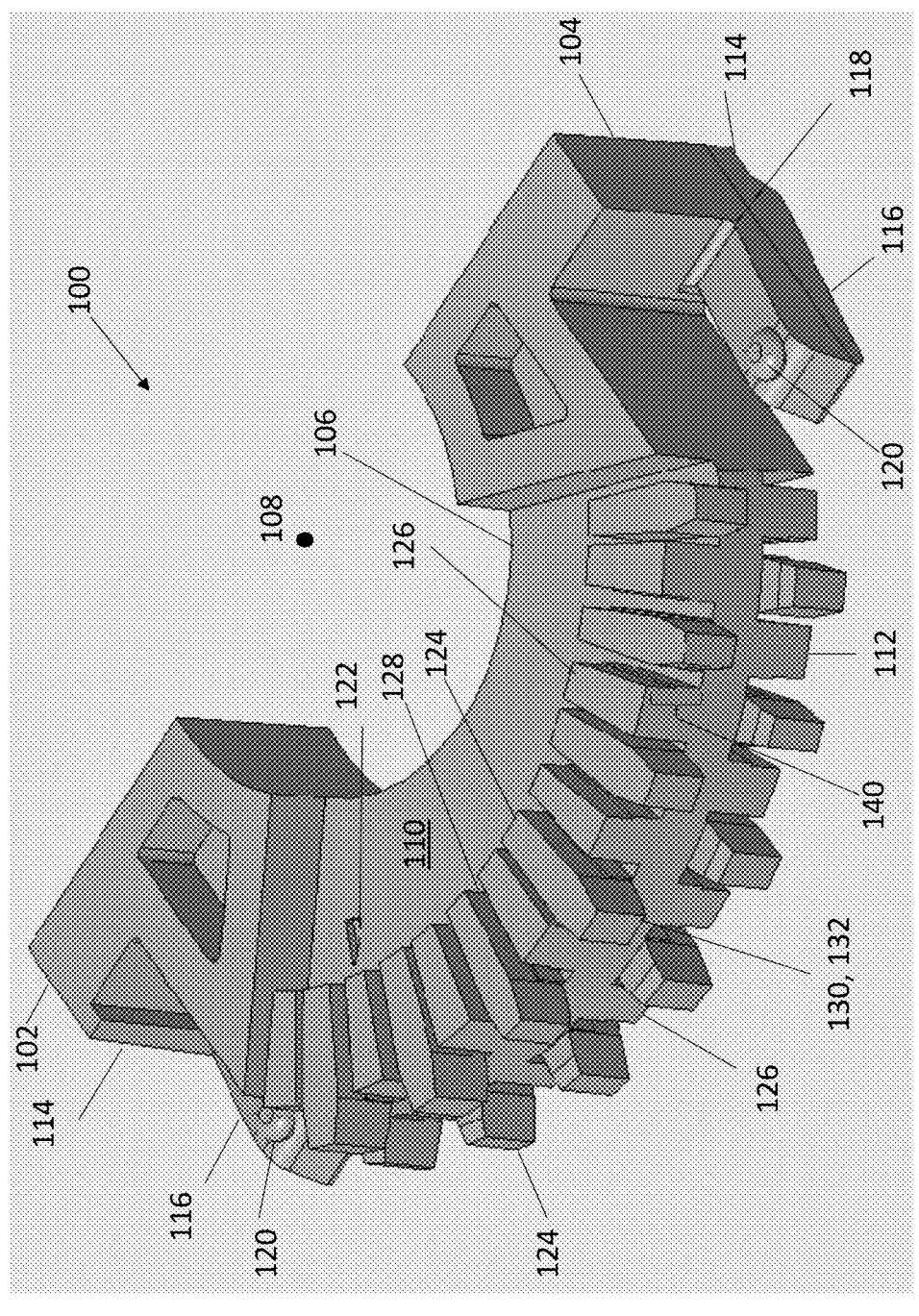
FIG. 1 is a perspective view of a wire comb in accordance with the present disclosure.

FIG. 1 depicts a wire comb 100 whose material is made from a molded resin or plastic, including, for example, a rigid PVC resin, nylon, HDPE, PVC, ABS, PC or other like materials. However, it is contemplated that the wire comb 100 can be made from any material capable of being formed into the depicted shape, including, for example, metals such as a cast metal, a sintered metal, or a powdered metal. It is further contemplated that the wire comb 100 can be machined from a stock material such as a metal forging or Delrin feedstock. Accordingly, the wire comb 100 is defined by a single, integrally formed body that includes a first end 102 and a second end 104. The first and the second ends 102 and 104 are joined by a circular or otherwise arcuate section 106. As used herein the term "arcuate" shall refer to a genus including all possible types of curves, examples of which include circular, elliptical, parabolic, hyperbolic, straight, rational curves, splines or any curve capable of being mathematically defined. The body of wire comb 100 is generally flat and defines a top a surface 110 and a bottom surface 112. As should be apparent, the single, integrally formed body of wire comb 100 allows for minimizing the steps of manufacturing. For example, a molding process would be able to form the disclosed features of wire comb 100 in a minimum or even single step.

Figure 2:
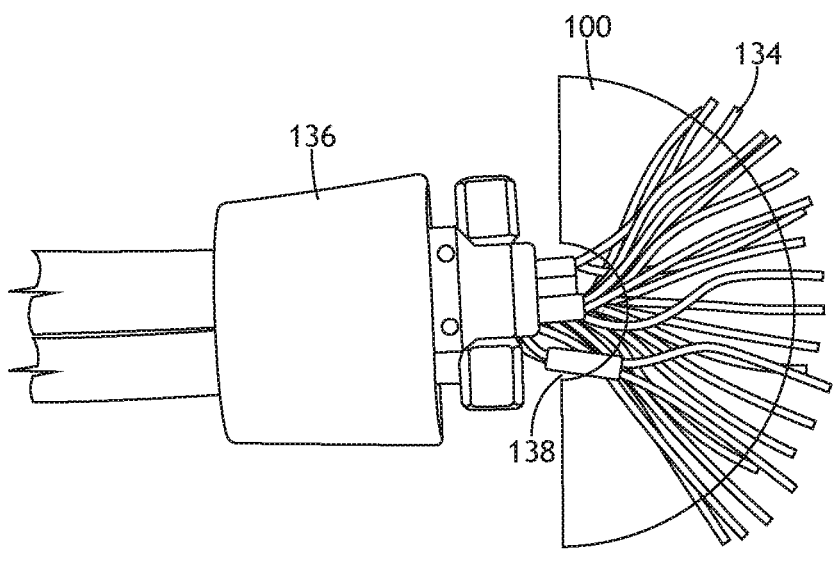
FIG. 2 is a top view of the wire comb of FIG. 1 presenting individual wires from a multi-wire cable.

Each of the first end 102 and the second end 104 defines an attachment mechanism 114. The attachment mechanism 114 includes an arm 116, a living hinge 118, and a dimple 120. The living hinge 118 joins the arm 116 to the body of wire comb 100. The arm 116 extends away from the body of the wire comb 100. The arm 116 allows the wire comb 100 to "snap" onto the board. For example, when the arm 116 is displaced either up or down (normal to top and bottom surfaces 110 and 112), the living hinge 118 provides a biasing force opposite the displacement of the arm 116 relative to the body of wire comb 100. The dimple 120 provides a complementary surface for engaging another component. Referring briefly to FIGS. 2-3, the wire comb 100 engages a PCB and will be described in detail below. As will be apparent, the described structures of the living hinge 118 and the dimple 120 allow construction of the wire comb 100 without the need for additional components such as a fastener or adhesive. However, other methods of attaching the wire comb 100 to a circuit board are contemplated including a friction, compression or pressure fit; an ultrasonic bond or weld; and a heat stake or thermal bonding method.

An arcuate section 106 is disposed between the first end 102 and the second end 104. The arcuate section includes a marking 122 to identify a correct position of the wire comb 100. The arcuate section 106 further defines a number of guide features 124, 126. Said guide features, 124, 126 are defined on both the top surface 110 and the bottom surface 112. As depicted, the sweep of the arcuate section 106 as well as each of the guide features 124, 126 correspond to concentric circular arcs, each arc having a center 108. However, the arcuate section 106 and the guide feature 124, 126 can correspond to any mathematically similar arc (such as the centroid of an ellipse, the foci of a hyperbola, etc.). Stated differently, a line drawn longitudinally along each guide feature 124 would intersect with center 108. Additionally, the center 108 is also the center of the curve of the arcuate section 106. Guide features 124, 126 are depicted in two types although their arrangement can vary. A first type of guide feature is guide feature 124 which can include a slight taper in the longitudinal direction. A second type of guide feature is guide feature 126 which also can include a slight taper that is complementary to the slight taper of guide feature 124. As will be apparent, the complementary longitudinal tapers of guide features, 124, 126 cooperate to form a rectangular channel 128. The first guide feature 124 can also include an overhang 130. Each overhang 130 further includes a hook 132. As depicted, the hook 132 can be a taper defined in the overhang 130 to help grip a component. The hook 132 allows the overhang 130 to operate as a "tooth" in order to grip a component. The angle formed between each of the guide features 124, 126 with the origin being center 108, is preferably 7.30 degrees.

FIG. 2 depicts a number of individual wires 134 from a multi-wire cable 136 mounted onto the wire comb 100. The individual wires 134 are presented in a circular shape that is determined by the curve of the arcuate section 106. As will be readily apparent, a circular curve is the preferable curvature of the arcuate section 106. Utilizing a circular layout allows for all the wires 134 to be trimmed to an equal length instead of needing to trim each wire to a number of varying lengths depending on which pin on a rectangular connector they are assigned to. Moreover, a cut-out 138 allows stress relief for cable 136. The location of the cut-out 138 is selected to position the cable 136 as close to the arcuate section 106 as possible. As will be further apparent, the features of the wire comb 100 allow for minimizing the exposed portion of wires 134 thereby minimizing potential for electromagnetic interference (EMI).

The width of each channel 128 corresponds to the diameter of each individual wire 134. As should be apparent, the diameters of wire channel 128 corresponding to individual wires 134 allows for the wires 134 to be press fit into place. Without additional parts such as adhesive or tape, the wires 134 may be locked into place and will not pop out or fall out during handling of the PCBA. In some embodiments, the width of each channel 128 may also allow each individual wire 134 to freely move. In those embodiments, a piece of tape (i.e. polyimide tape or KAPTON tape) or adhesive (i.e. a silicon rubber based glue or potting material) may be required to retain each wire 134 in its respective channel 128. Each channel also includes a number of tiers 140. The tiers 140 segregate the channel 128 into a smaller channel and a larger channel which can respectively accommodate a wire of a smaller diameter and a wire of a larger diameter. For example, different types of multi-wire cables 136, which can correspond to HDMI, DP, and mini DP types, can have varying diameters of wires 134. Preferably, the width of each channel 128 can range from 0.010 inches (0.25 millimeters or 10 mils) to 0.031 inches (0.79 millimeters or 30 mils). Preferably, the width of each smaller channel 128a is larger than 0.010 inches (0.25 millimeters or 10 mils). Preferably, the width of each larger channel 128b is smaller than 0.031 inches (0.79 millimeters or 30 mils). However, the width and spacing of each channel 128 can be any width so long as the wire comb 100 can accommodate the number of wires 134 in the cable 136 while providing enough clearance to facilitate a desired thickness for the purpose of an overmolding process. For example, a larger width would be desirable for a cable 136 with fewer wires 134. In cases where a minimum width must be maintained for a cable 136 with a great number of wires 134, the overall size of the wire comb 100 can be increased.

Figure 3A:
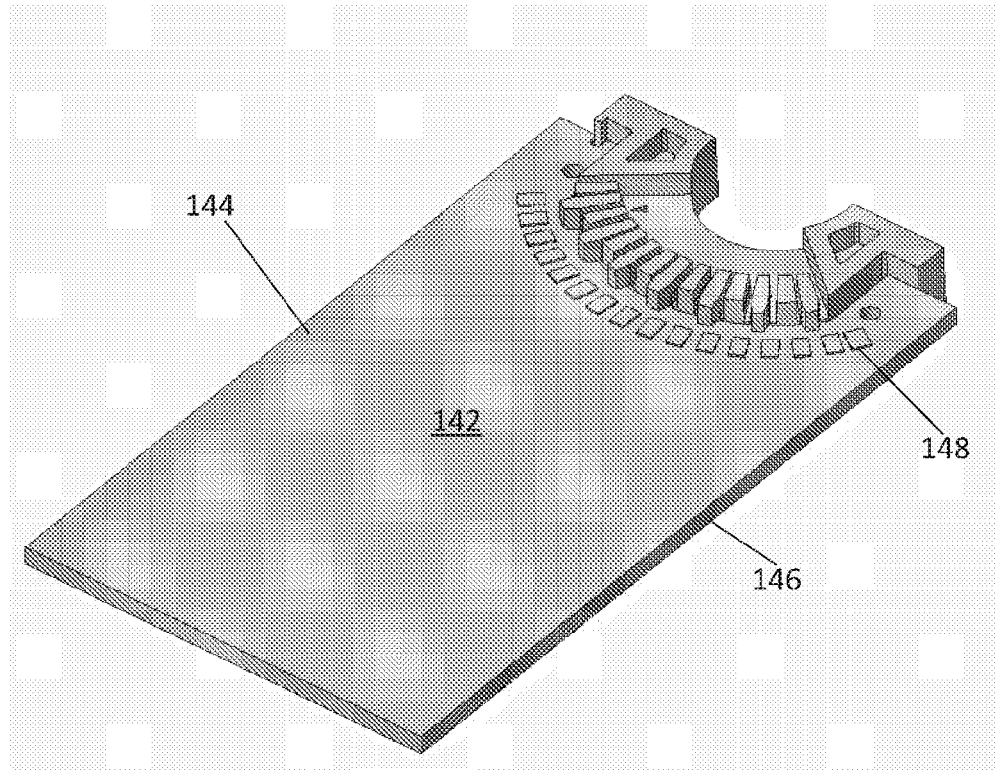
FIG. 3A is a perspective view of the wire comb of FIG. 1 mounted onto a printed circuit board thereby forming a printed circuit board assembly.
Figure 3B:
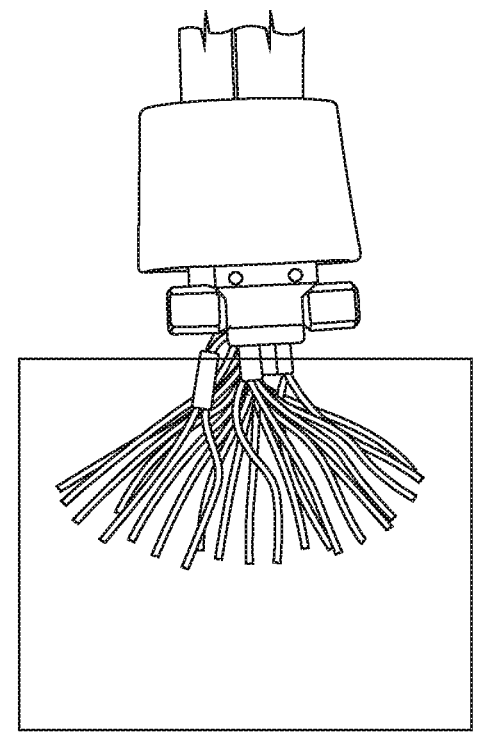
FIG. 3B and FIG. 4 are a top view of the wire comb and multi-wire cable of FIG. 2 mounted onto a printed circuit board thereby forming a printed circuit board assembly.
Figure 4:
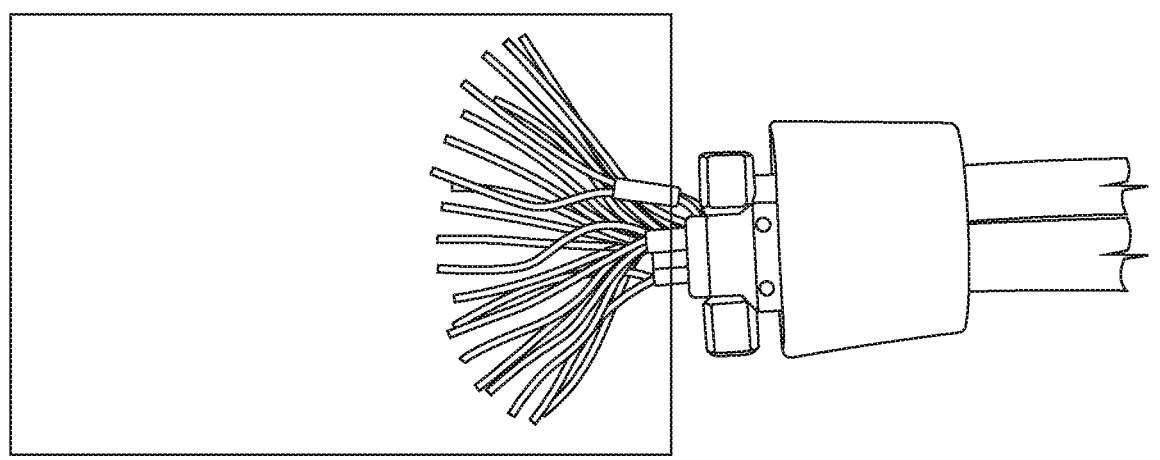

Now turning to FIGS. 3A, 3B and 4, each of the aforementioned figures depicts wire comb 100 engaging a PCB 142. As alluded to earlier, the overhang 130 of first guide feature 124 cooperates with complementary overhangs 130 to engage the PCB 142. The hooks 132 allow the overhangs 130 to operate in a "tooth" like manner preventing the wire comb 100 from tipping or otherwise becoming misaligned relative to the PCB 142. In some embodiments, the PCB 142 can further include a cutout. The cutout allows the wire comb 100 to be positioned such that the overhangs 130 more completely engage the PCB 142. The PCB 142 includes a top surface 144 and a bottom surface 146 (not shown). The PCB 142 includes circuitry necessary for supporting the function of the cable 136. Preferably, the PCB 142 includes circuitry necessary for interfacing with a USB-C cable. The top surface 144 can be identical or different from the bottom surface 146. However, both the top and bottom surfaces 144, 146 define a number of solder pads 148. As depicted, there are sixteen (16) solder pads 148 on the top surface 144 and a similar number of sixteen (16) solder pads on the bottom surface 146 (not depicted). The total of thirty-two (32) corresponds with the number of connections required for a USB-C interface. However, the total number of solder pads can vary between 15-18 (on each side) as required for a USB-C interface. As should be apparent, the shape of the wire comb 100 allows for the wires 134 to exit the wire comb 100 flush to the PCB 142 which thereby facilitates efficient soldering due to proper positioning of the wires 134 relative to the solder pads 148.

Figure 5A:
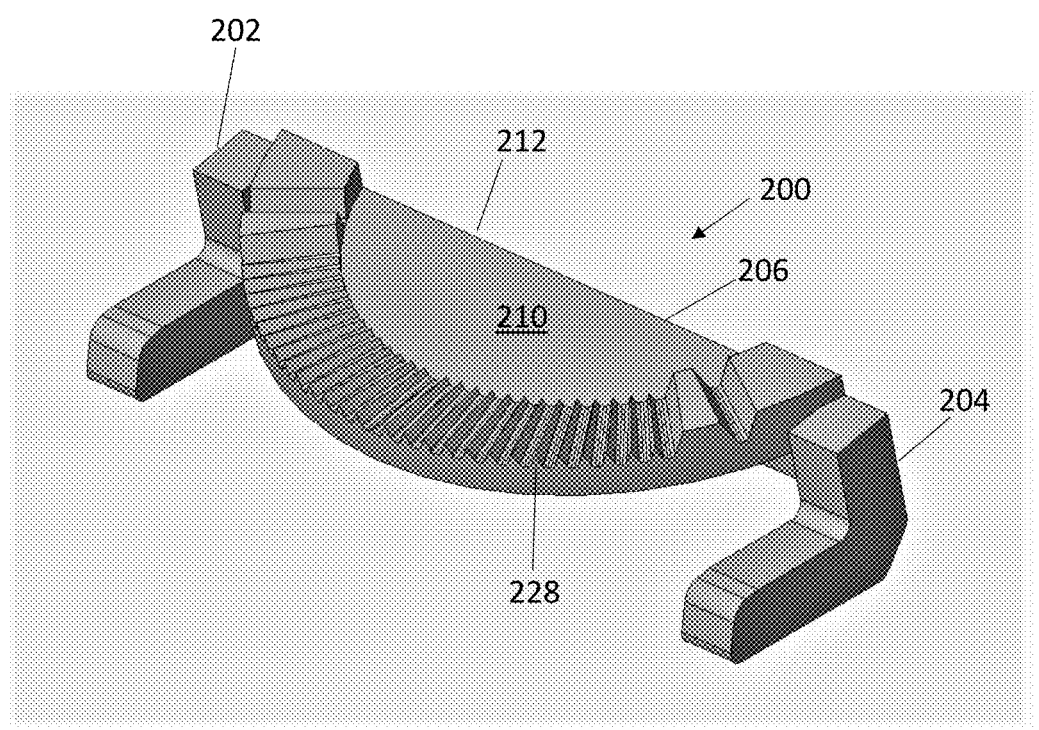
FIG. 5A is a perspective view of a second alternative embodiment of a wire comb of the present disclosure.
Figure 5B:
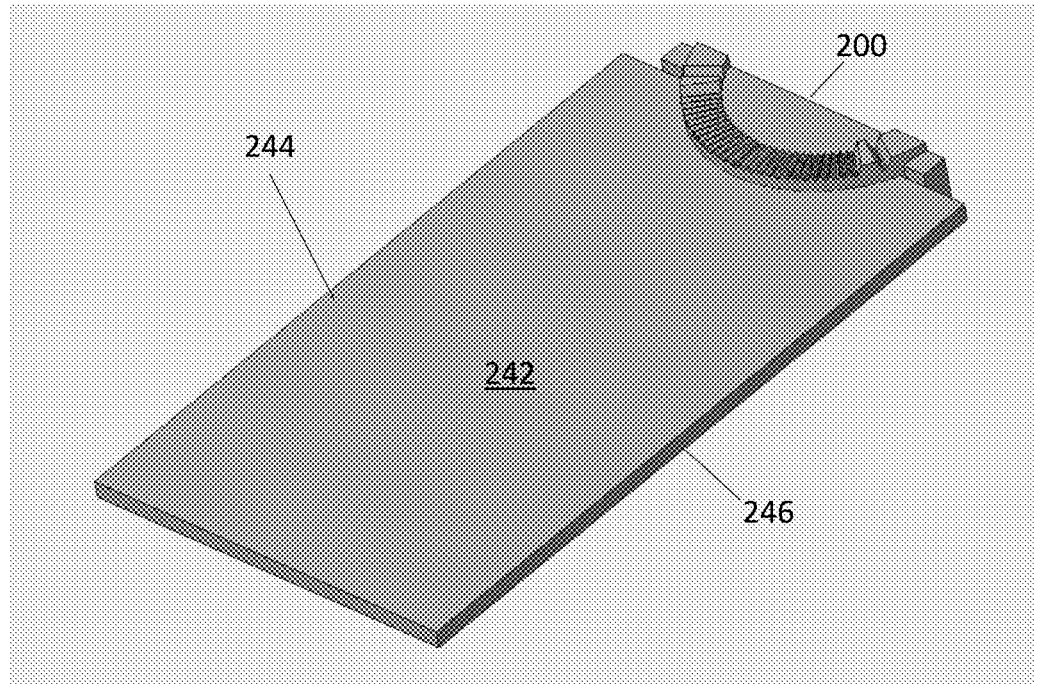
FIG. 5B is a perspective view of the wire comb of FIG. 5A mounted onto a circuit board thereby forming a second alternative embodiment of a printed circuit board assembly.

Referring to FIG. 5A a wire comb 200 is depicted. Referring further to FIG. 5B the wire comb 200 is depicted as mounted on a PCB 242. Like the wire comb 100, the wire comb 200 is defined by a single, integrally formed body that includes a first end 202 and a second end 204, each of ends 202, 204 being joined by an arcuate section 206. While the wire comb 200 is not exactly the same as the wire comb 100 previously described in FIG. 1, reference numerals which correspond to like elements of and relating to the wire comb 100 are designated by the same reference numbers in the 200 series in FIGS. 5A-5B. The wire comb 200 varies in that channels 228 and related features are only defined on the top surface 210. Accordingly, the widths of the channels 228 are only able to accommodate smaller diameters of wire when compared to channels 128 (depicted in FIG. 1). Because the channels 228 are only present on the top surface 210, then there is no need for an overhang to act as a "tooth," because the bottom surface 212 engages the PCB 242. In addition, the PCB 242 does not require a cutout.

Figure 6A:
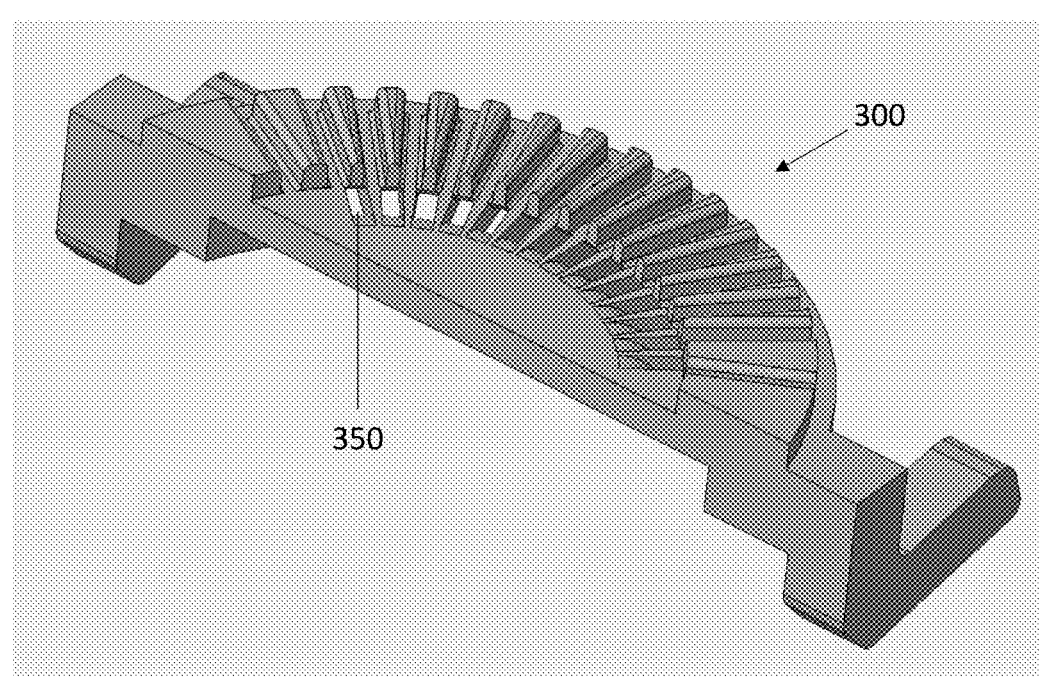
FIGS. 6A-6D are views of a third alternative embodiment of a wire comb of the present disclosure.
Figure 6B:
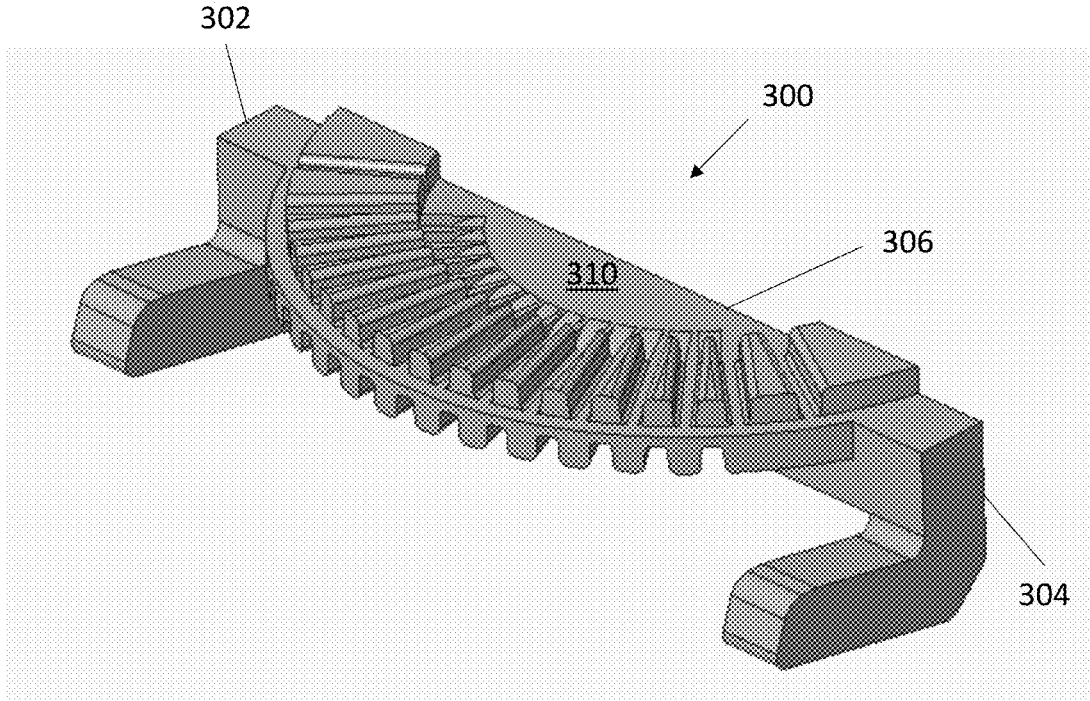
Figure 6C:
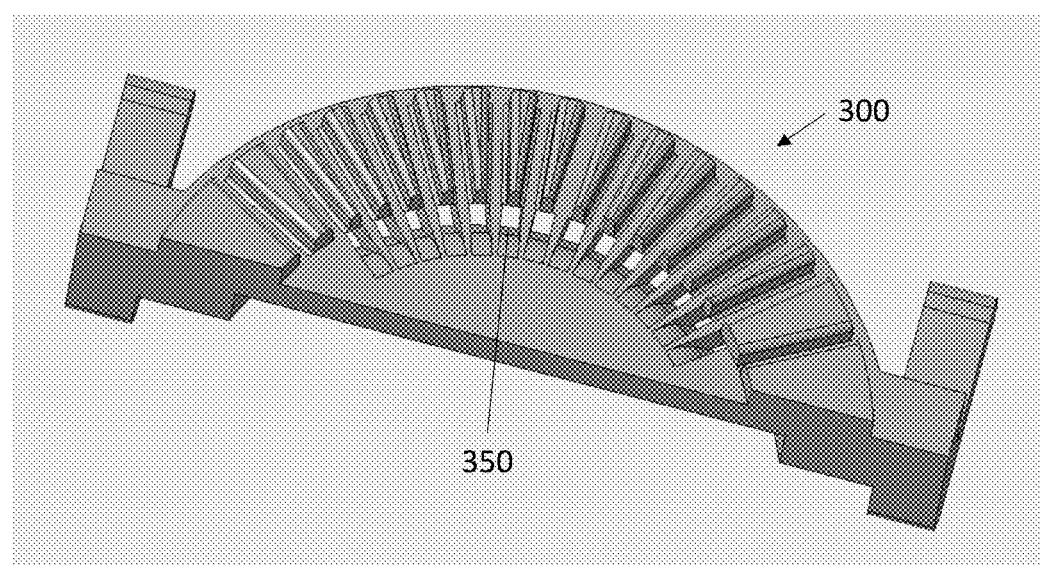
Figure 6D:
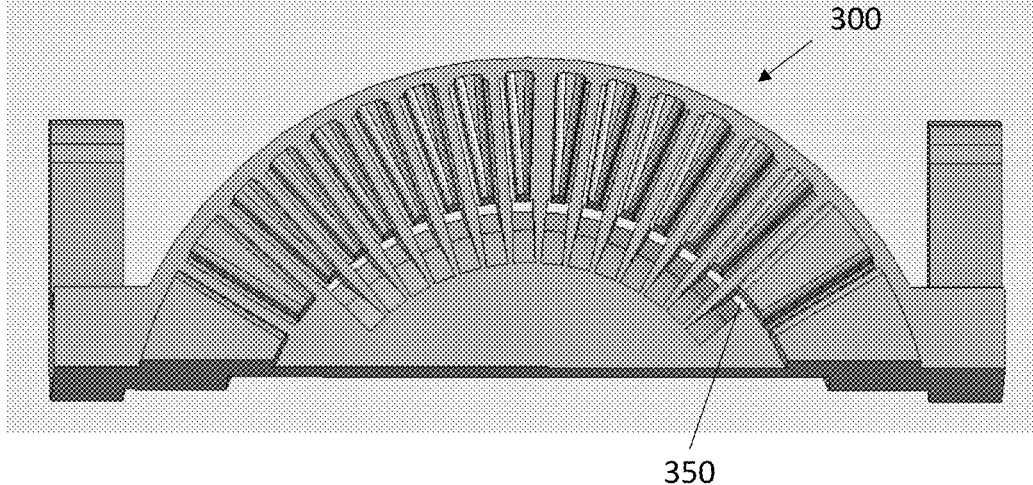
Figure 6E:
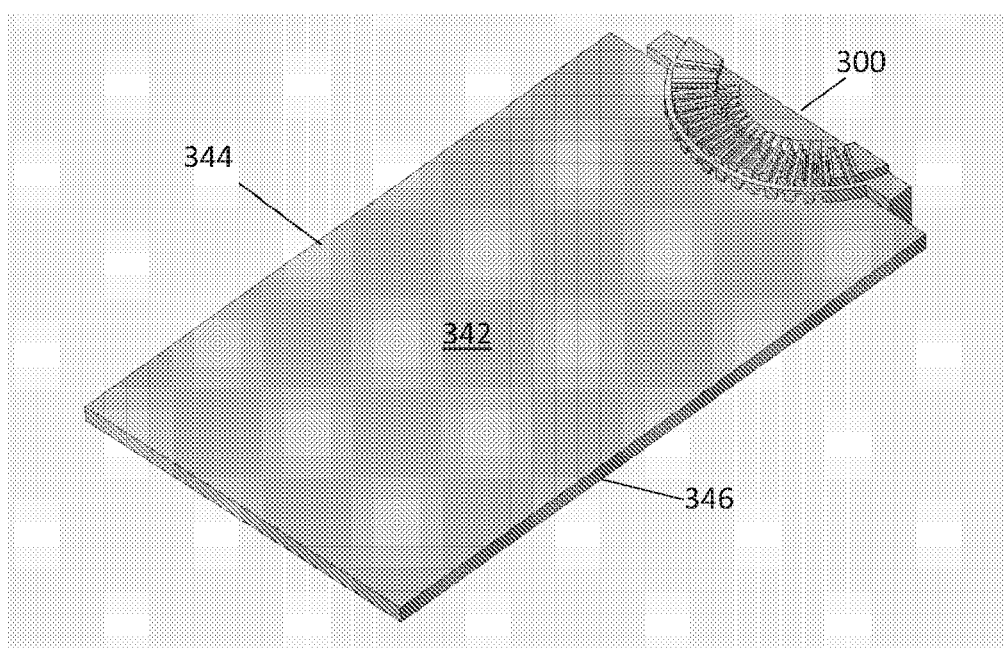
FIG. 6E is a perspective view of the wire comb of FIGS. 6A-D mounted onto a circuit board thereby forming a third alternative embodiment of a printed circuit board assembly.

Referring to FIGS. 6A-6D a wire comb 300 is depicted. Referring further to FIG. 6E the wire comb 300 is depicted as mounted on a PCB 342. Like the wire combs 100 and 200, the wire comb 300 is defined by a single, integrally formed body that includes a first end 302 and a second end 304, each of ends 302, 304 being joined by an arcuate section 306. While the wire comb 300 is not exactly the same as wire comb 100 previously described in FIG. 1 nor the wire comb 300 previously described in FIG. 5A, reference numerals which correspond to like elements of and relating to the wire comb 100 and the wire comb 200 are designated by the same reference numbers in the 300 series in FIGS. 6A-6E. The wire comb 300 varies in that the arcuate section 306 further defines tunnels 350. The tunnels 350 allow wires to come up through the arcuate section 306. Accordingly, wires can be soldered to both sides of the PCB 342 while being routed proximate the top surface 344. Like wire comb 200, the structure of wire comb 300 does not required an overhang to act as a "tooth," thereby obviating the need for a cutout on the PCB 342.

Figure 7:
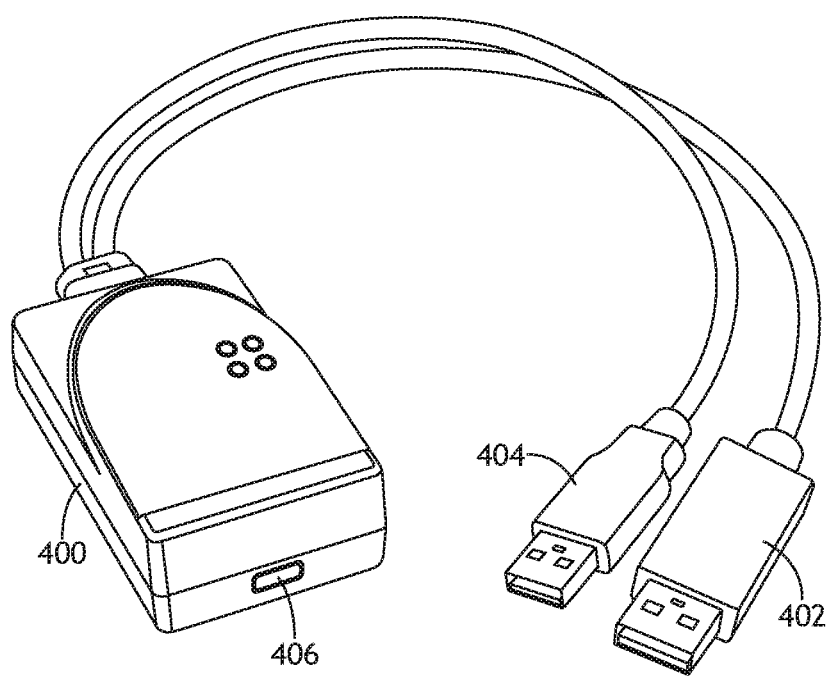
FIG. 7 is a perspective view of a display dongle including the printed circuit board assembly of FIGS. 3A-3B, in accordance with the present disclosure.

FIG. 7 is an application of the wire comb 100 (depicted in FIG. 1) and the PCBA (depicted in FIG. 2). The USB-C primary interface module 400 in this example includes a DP connector 402 for making a video connection with a target device (e.g. a server) and a USB Type A connector 404 for making a serial connection. A USB-C port 406 on each module 400 enables connection to a Keyboard Video Mouse (KVM) device such as the ADX IPUHD 4K IP KVM manufactured by Applicant. As should be apparent, more recent iterations of the USB standard, such as USB3 and USB-C, are more susceptible to EMI. Accordingly, a wire comb in accordance with the present disclosure can be utilized in module 400 in place of a standard connector such as a MOLEX type connector in order to minimize EMI interference.

Alternative embodiments are contemplated in which a single wire comb incorporates tunnels (such as in wire comb 300) and channels (such as in wire comb 100). For example, a first section of a top surface of the arcuate section can include a first area that includes tunnels 350 and a second section of a the top surface that includes channels 128. A first section of the bottom surface of the arcuate section can also include a first area that includes additional tunnels 350 and a section of the bottom surface that includes channels 128. Such an embodiment is specifically contemplated for use with multi-wire cables having thick insulation when compared to the individual wires.

Since many modifications, variations, and changes in detail can be made to the described preferred embodiments of the invention, it is intended that all matters in the foregoing description and shown in the accompanying drawings be interpreted as illustrative and not in a limiting sense. Thus, the scope of the invention should be determined by the appended claims and their legal equivalents.

What is claimed is:

1. A wire comb comprising:
a flat body comprising a first end and a second end connected by an arcuate section comprising an upper surface and a lower surface;
a first wire mount area on the upper surface forming at least one opening formed in the upper surface with each opening comprising a first shape selected to receive and hold a wire within; and
a mounting feature extending from at least one of the first end and the second end, and adapted to engage a printed circuit board,
wherein the first wire mount area further comprises:
a first guide feature; and
a second guide feature,
wherein the first guide feature and the second guide feature cooperate to form a first of the at least one opening formed in the upper surface,
wherein the second guide feature comprises an overhang extending over the upper surface, said overhang configured to engage the printed circuit board.

2. The wire comb of claim 1 wherein the overhang further comprises a taper for engaging the printed circuit board.

3. The wire comb of claim 1 wherein the first wire mount area further comprises:
a third guide feature; and
a fourth guide feature,
wherein the third guide feature and the fourth guide feature cooperate to form a second of the at least one opening formed in the upper surface,
wherein the second of the at least one opening has a second shape different than the first shape selected to receive and hold a wire within.

4. The wire comb of claim 1 further comprising:
a second wire mount area on the lower surface forming at least one opening formed in the lower surface with each opening comprising a second shape selected to receive and hold a wire within, the second wire mount area comprising:
a third guide feature; and
a fourth guide feature,
wherein the third guide feature and the fourth guide feature cooperate to form a first of the at least one opening formed in the lower surface.

5. The wire comb of claim 1 wherein the mounting feature comprises:
an arm extending away from the flat body;
a living hinge connecting the arm to the flat body; and
a dimple disposed on the arm.

6. The wire comb of claim 1 wherein each of the at least one opening are further formed in the lower surface and extend between the upper surface and the lower surface of the arcuate section.

7. A circuit board assembly comprising:
a printed circuit board (PCB) comprising an upper surface and a lower surface, opposing ends, and side edges;
a wire comb mounted on the upper surface of and proximate to one of the opposing ends of the PCB, said wire comb comprising:

a flat body comprising a first end and a second end connected by an arcuate section comprising an upper surface and a lower surface;

a wire mount area on the upper surface forming a plurality of openings each opening formed in the upper surface and comprising a first shape, wherein the printed circuit board further comprises a plurality of solder pads arranged in an arcuate pattern and corresponding to the plurality of openings of the wire mount area; and a mounting feature extending from at least one of the first end and the second end and engaging the lower surface of the printed circuit board; and a multi-wire cable comprising a plurality of wires arranged in an arcuate pattern corresponding to the arcuate section of the flat body of the wire comb, each wire comprising:

an insulated portion located in one of the plurality of openings of the wire mount area; and a stripped portion located proximate the upper surface of the printed circuit board.

8. The circuit board assembly of claim 7 further comprising solder attaching each of the stripped portion of each wire to each of the plurality of solder pads.

9. The circuit board assembly of claim 7 wherein the insulated portion of each wire is secured to each of the plurality of openings with one of a press fit, an adhesive, or tape.

10. The circuit board assembly of claim 7 wherein the wire mount area further comprises:

a first guide feature; and a second guide feature, wherein the first guide feature and the second guide feature cooperate to form one of the plurality of openings formed in the upper surface of the arcuate section.

11. The circuit board assembly of claim 10 wherein the second guide feature comprises an overhang extending over the upper surface of the arcuate section, said overhang engaging the upper surface of the printed circuit board.

12. The circuit board assembly of claim 11 wherein the overhang further comprises a taper, said taper engaging the upper surface of the printed circuit board.

13. The circuit board assembly of claim 7 wherein the mounting feature comprises:

an arm extending away from the flat body;

a living hinge connecting the arm to the flat body and biasing the arm towards the lower surface of the printed circuit board; and a dimple disposed on the arm and engaging the lower surface of the printed circuit board.

14. A wire comb comprising:

an integrally formed body comprising a first end and a second end connected by an arcuate section comprising an upper surface and a lower surface; and a mounting feature extending from at least one of the first end and the second end and adapted to engage a printed circuit board, wherein the arcuate section defines a plurality of tunnels extending between the upper surface and the lower surface, each of the plurality of tunnels comprising a shape selected to receive and hold a wire within, wherein the arcuate section comprises:

a first guide feature;

a second guide feature, wherein the first guide feature and the second guide feature cooperate to form a portion of a first one of the plurality of tunnels;

a third guide feature; and a fourth guide feature, wherein the third guide feature and the fourth guide feature cooperate to form a portion of a second one of the plurality of tunnels, wherein the first one of the plurality of tunnels has a first width, and wherein the second one of the plurality of tunnels has a second width different than the first width.

15. The wire comb of claim 14 wherein the mounting feature comprises:

an arm extending away from the integrally formed body;

a living hinge connecting the arm to the integrally formed body; and a dimple disposed on the arm.

16. A circuit board assembly comprising:

a printed circuit board (PCB) comprising an upper surface and a lower surface, opposing ends, and side edges;

a wire comb mounted on the upper surface of and proximate to one of the opposing ends of the PCB, said wire comb comprising:

a flat body comprising a first end and a second end connected by an arcuate section comprising an upper surface and a lower surface;

a wire mount area on the upper surface forming a plurality of openings each opening formed in the upper surface and comprising a first shape; and a mounting feature extending from at least one of the first end and the second end and engaging the lower surface of the printed circuit board, wherein the mounting feature comprises:

an arm extending away from the flat body;

a living hinge connecting the arm to the flat body and biasing the arm towards the lower surface of the printed circuit board; and a dimple disposed on the arm and engaging the lower surface of the printed circuit board; and a multi-wire cable comprising a plurality of wires arranged in an arcuate pattern corresponding to the arcuate section of the flat body of the wire comb, each wire comprising:

an insulated portion located in one of the plurality of openings of the wire mount area; and a stripped portion located proximate the upper surface of the printed circuit board.

* * * * *